United States Patent
Zhang et al.

(10) Patent No.: US 11,522,030 B2
(45) Date of Patent: Dec. 6, 2022

(54) DISPLAY SUBSTRATE AND DISPLAY DEVICE WITH COMPENSATION PATTERN AND PLANARIZATION LAYERS, AND METHOD OF FORMING THE SAME

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yuanqi Zhang, Beijing (CN); Fengli Ji, Beijing (CN); Jianpeng Wu, Beijing (CN)

(73) Assignees: CHENGDU BOE OPTOELECTRONICS TECHNOLOGY CO., LTD., Sichuan (CN); Beijing BOE Technology Development Co., Ltd., Beijing (CN)

( * ) Notice: Subject to any disclaimer, the term of this patent is extended or adjusted under 35 U.S.C. 154(b) by 147 days.

(21) Appl. No.: 16/982,370

(22) PCT Filed: Apr. 21, 2020

(86) PCT No.: PCT/CN2020/085832
§ 371 (c)(1),
(2) Date: Sep. 18, 2020

(87) PCT Pub. No.: WO2020/216208
PCT Pub. Date: Oct. 29, 2020

(65) Prior Publication Data
US 2021/0159292 A1    May 27, 2021

(30) Foreign Application Priority Data
Apr. 24, 2019   (CN) .......................... 201910333265.6

(51) Int. Cl.
*H01L 27/32*    (2006.01)

(52) U.S. Cl.
CPC ...... *H01L 27/3258* (2013.01); *H01L 27/3272* (2013.01); *H01L 2227/323* (2013.01)

(58) Field of Classification Search
CPC ............. H01L 27/3258; H01L 27/3272; H01L 2227/323
See application file for complete search history.

(56) References Cited

U.S. PATENT DOCUMENTS

2010/0019996 A1    1/2010   You et al.
2015/0001492 A1    1/2015   Lee
(Continued)

FOREIGN PATENT DOCUMENTS

CN    103745985 A    4/2014
CN    106816558 A    6/2017
(Continued)

OTHER PUBLICATIONS

ISA China National Intellectual Property Administration, International Search Report and Written Opinion Issued in Application No. PCT/CN2020/085832, dated Jul. 1, 2020, WIPO, 14 pages. (Submitted with Partial Translation).
(Continued)

*Primary Examiner* — Lex H Malsawma
(74) *Attorney, Agent, or Firm* — McCoy Russell LLP

(57) ABSTRACT

A display substrate, a method of forming the display substrate and a display device are provided. The display substrate includes a base substrate, a functional pattern arranged at a side of the base substrate and a planarization layer arranged at a side of the functional pattern away from the base substrate. The planarization layer includes a first part and a second part, an orthographic projection of the first part to the base substrate coincides with an orthographic projection of the functional pattern to the base substrate, and an orthographic projection of the second part to the base
(Continued)

substrate does not overlap the orthographic projection of the functional pattern to the base substrate.

17 Claims, 3 Drawing Sheets

(56) References Cited

U.S. PATENT DOCUMENTS

| | | | |
|---|---|---|---|
| 2015/0021637 A1* | 1/2015 | Ahn | H01L 27/3218 257/89 |
| 2016/0071919 A1 | 3/2016 | Chen | |
| 2016/0104756 A1 | 4/2016 | Lee et al. | |
| 2016/0253972 A1* | 9/2016 | Bai | H01L 27/3216 345/690 |
| 2018/0061859 A1 | 3/2018 | Wen | |
| 2019/0011830 A1* | 1/2019 | Ji | H01L 27/3216 |
| 2019/0064552 A1* | 2/2019 | Kim | H01L 27/3279 |
| 2019/0131358 A1* | 5/2019 | Yang | H01L 27/3218 |
| 2020/0328264 A1 | 10/2020 | Wu et al. | |

FOREIGN PATENT DOCUMENTS

| | | |
|---|---|---|
| CN | 106920804 A | 7/2017 |
| CN | 108695370 A | 10/2018 |
| CN | 109427854 A | 3/2019 |
| CN | 110021654 A | 7/2019 |

OTHER PUBLICATIONS

State Intellectual Property Office of People's Republic of China, Office Action and Search Report Issued in Application No. 201910333265.6, dated Aug. 28, 2020, 17 pages. (Submitted with Partial Translation).

* cited by examiner

DISPLAY SUBSTRATE AND DISPLAY DEVICE WITH COMPENSATION PATTERN AND PLANARIZATION LAYERS, AND METHOD OF FORMING THE SAME

CROSS-REFERENCE TO RELATED APPLICATION

This application claims a priority to a Chinese Patent Application No. 201910333265.6 filed in China on Apr. 24, 2019, the disclosure of which is incorporated herein in its entirety by reference.

TECHNICAL FIELD

The present disclosure relates to the field of display technology, in particular to a display substrate, a method of forming the display substrate and a display device.

BACKGROUND

An Organic light emitting diode (OLED) display panel has attracted much attention due to its advantages such as high response speed, high contrast, large viewing angle, and low energy consumption. Moreover, along with continuous development of OLED display technology, a user is demanding a high requirement for color display performance of the OLED display panel. However, most OLED display panels in the related art have a problem of poor chromatic aberration symmetry which will cause an adverse impact on the display performance of the display panel, thereby resulting in a poor usage experience.

SUMMARY

A display substrate is provided in the present disclosure, including a base substrate, a functional pattern arranged at a side of the base substrate and a planarization layer arranged at a side of the functional pattern away from the base substrate. The planarization layer includes a first part and a second part, an orthographic projection of the first part to the base substrate coincides with an orthographic projection of the functional pattern to the base substrate, and an orthographic projection of the second part to the base substrate does not overlap the orthographic projection of the functional pattern to the base substrate. In a direction perpendicular to the base substrate, a height from a surface of the first part away from the base substrate and a height from a surface of the second part away from the base substrate are identical.

Optionally, the display substrate further includes a compensation functional pattern insulated from the functional pattern. The orthographic projection of the functional pattern to the base substrate is complementary to an orthographic projection of the compensation functional pattern to the base substrate.

Optionally, the functional pattern and the compensation functional pattern are at an identical layer, the compensation functional pattern is covered by the second part of the planarization layer, and in the direction perpendicular to the base substrate, a thickness of the compensation functional pattern and a thickness of the functional pattern are identical.

Optionally, the compensation functional pattern is located at the side of the functional pattern away from the base substrate, and the planarization layer is located at a side of the compensation functional pattern away from the base substrate, the display substrate further includes: a compensation planarization layer located between the compensation functional pattern and the functional pattern in the direction perpendicular to the base substrate. In the direction perpendicular to the base substrate, a sum of a thickness of the functional pattern, a thickness of the compensation planarization layer and a thickness of the planarization layer and a sum of the thickness of the compensation planarization layer, a thickness of the compensation functional pattern and the thickness of the planarization layer are identical.

Optionally, the display substrate further includes an anode layer located on a surface of the planarization layer away from the base substrate.

Optionally, the surface of the first part of the planarization layer away from the base substrate is flush with the surface of the second part of the planarization layer away from the base substrate, and the surface of the first part of the planarization layer away from the base substrate and the surface of the second part of the planarization layer away from the base substrate are on a same plane.

Optionally, a sum of a thickness of the first part of the planarization layer and a thickness of the functional pattern is identical to a thickness of the second part of the planarization layer.

Optionally, the functional pattern includes a plurality of functional sub-patterns, and the orthographic projection of the second part of the planarization layer to the base substrate is located between orthographic projections of adjacent functional sub-patterns to the base substrate.

Optionally, the functional pattern includes a plurality of functional sub-patterns, the orthographic projection of the compensation functional pattern to the base substrate is located between orthographic projections of adjacent functional sub-patterns to the base substrate, and the orthographic projection of the compensation functional pattern to the base substrate coincides with the orthographic projection of the second part of the planarization layer to the base substrate.

Optionally, the compensation planarization layer includes a first part and a second part, an orthographic projection of the first part of the compensation planarization layer to the base substrate overlaps the orthographic projection of the first part of the planarization layer to the base substrate, and an orthographic projection of the second part of the compensation planarization layer to the base substrate coincides with the orthographic projection of the second part of the planarization layer to the base substrate.

Optionally, in the direction perpendicular to the base substrate, a sum of a thickness of the first part of the planarization layer, a thickness of the first part of the compensation planarization layer and the thickness of the functional pattern is identical to a sum of a thickness of the second part of the planarization layer, a thickness of the second part of the compensation planarization layer and the thickness of the compensation functional pattern.

A display device including the above display substrate is further provided in the present disclosure.

A method of manufacturing the above display substrate is further provided in the present disclosure, including: providing the base substrate; forming the functional pattern on the base substrate; and forming the planarization layer at the side of the functional pattern away from the base substrate. The planarization layer includes the first part and the second part, the orthographic projection of the first part to the base substrate coincides with the orthographic projection of the functional pattern to the base substrate, the orthographic projection of the second part to the base substrate does not overlap the orthographic projection of the functional pattern to the base substrate, and in the direction perpendicular to the base substrate, the height from the surface of the first part away from the base substrate and the height from the surface of the second part away from the base substrate are identical.

Optionally, the forming the functional pattern on the base substrate includes: forming the functional pattern and a compensation functional pattern insulated from the functional pattern. The orthographic projection of the functional pattern to the base substrate is complementary to an orthographic projection of the compensation functional pattern to the base substrate.

Optionally, the forming the functional pattern and the compensation functional pattern includes: forming a functional film layer by using a metallic conductive material; patterning the functional film layer to form the functional pattern by using a first mask including a light-transmitting region and a light-shielding region; forming an insulation film layer by using an insulation material at the side of the functional pattern away from the base substrate; and patterning the insulation film layer to form the compensation functional pattern by using a second mask including a light-transmitting region and a light-shielding region. The functional pattern and the compensation functional pattern are at an identical layer, and the compensation functional pattern is covered by the second part of the planarization layer. In the direction perpendicular to the base substrate, a thickness of the compensation functional pattern and a thickness of the functional pattern are identical. In a case the first mask and the second mask are superposed on the base substrate, an orthographic projection of the light-transmitting region of the second mask to the base substrate overlaps an orthographic projection of the light-shielding region of the first mask to the base substrate, and an orthographic projection of the light-shielding region of the second mask to the base substrate overlaps an orthographic projection of the light-transmitting region of the first mask to the base substrate.

Optionally, the forming the functional pattern and the compensation functional pattern includes: forming a functional film layer by using a metallic conductive material; patterning the functional film layer to form the functional pattern by using a first mask including a light-transmitting region and a light-shielding region; forming a compensation planarization layer at the side of the functional pattern away from the base substrate; forming a compensation functional film layer at a side of the compensation planarization layer away from the base substrate by using the metallic conductive material; patterning the compensation functional film layer to form the compensation functional pattern by using a second mask including a light-transmitting region and a light-shielding region; in a case the first mask and the second mask are superposed on the base substrate, an orthographic projection of the light-transmitting region of the second mask to the base substrate overlaps an orthographic projection of the light-shielding region of the first mask to the base substrate, and an orthographic projection of the light-shielding region of the second mask to the base substrate overlaps an orthographic projection of the light-transmitting region of the first mask to the base substrate; and the forming the planarization layer at the side of the functional pattern away from the base substrate includes: forming the planarization layer at a side of the compensation functional pattern away from the base substrate, in the direction perpendicular to the base substrate, a sum of a thickness of the functional pattern, a thickness of the compensation planarization layer and a thickness of the planarization layer and a sum of the thickness of the compensation planarization layer, a thickness of the compensation functional pattern and the thickness of the planarization layer are identical.

Optionally, the method further includes: forming an anode layer on a surface of the planarization layer away from the base substrate.

Optionally, the forming the planarization layer includes: forming a planarization material film, where the planarization material film includes a first part covering the functional pattern and a second part not covering the functional pattern, and in the direction perpendicular to the base substrate, a height from a surface of the first part of the planarization material film away from the base substrate to a surface of the base substrate formed with the functional pattern and a height from a surface of the second part of the planarization material film away from the base substrate to the surface of the base substrate formed with the functional pattern are identical; curing the planarization material film; determining a difference between respective shrinkage amounts corresponding to the first part and the second part of the planarization material film after being cured in the direction perpendicular to the base substrate; forming a target mask in accordance with the difference between the respective shrinkage amounts corresponding to the first part and the second part of the planarization material film after being cured; where the target mask includes a target light-shielding region and a target light-transmitting region, and an exposure depth corresponding to the target light-transmitting region in the direction perpendicular to the base substrate is identical to the difference in a case that the cured planarization material film is exposed by using the target mask; exposing the cured planarization material film by using the target mask to form a planarization material film reserved region and a planarization material film semi-reserved region, where the planarization material film semi-reserved region corresponds to a region where a part of the planarization layer covering the functional pattern is located, and the planarization material film reserved region corresponds to other regions except the region where the part of the planarization layer covering the functional pattern is located; and removing the planarization material film in the planarization material film semi-reserved region by using a developer to form the planarization layer.

BRIEF DESCRIPTION OF THE DRAWINGS

The following drawings are provided to facilitate the understanding of the present disclosure, and constitute a portion of the present disclosure. These drawings and the following embodiments are for illustrative purposes only, but shall not be construed as limiting the present disclosure. In these drawings.

DETAILED DESCRIPTION

In order to further illustrate a display substrate, a method of forming the display substrate and a display device according to some embodiments of the present disclosure, a detailed description will be given below with reference to the accompanying drawings.

An OLED display panel in the related art mainly includes: a thin film transistor array layer that drives each sub-pixel unit in the OLED display panel to display, a planarization layer (of which a thickness generally ranges from 1.0 μm to 3.0 μm) arranged on the thin film transistor array layer, a plurality of anode patterns arranged on a surface of the planarization layer away from the thin film transistor array layer, the plurality of anode patterns are connected to a plurality of thin film transistors included in the thin film transistor array layer in one-to-one correspondence (specifically, this connection may be realized by forming via holes on the planarization layer), and a pixel definition layer arranged at a side of an anode layer away from the planarization layer. The pixel definition layer defines openings that are in one-to-one correspondence with the anode patterns, and each opening is formed with a sub-pixel unit. A cathode layer is further provided on a surface of the sub-pixel unit away from the anode patterns.

When the OLED display panel having the above structure realizes a display function, a driving signal may be applied to the cathode layer, and a driving signal may be applied to the corresponding anode patterns through the thin film transistors in the thin film transistor array layer, such that a driving electric field is formed between the anode layer and the cathode layer to drive the sub-pixel units located between the anode patterns and the cathode layer to emit light, realizing the display function of the OLED display panel.

For the related art, it has been studied that, since the sub-pixel units are formed on the anode patterns, in a case that a surface formed by the anode patterns used to form the sub-pixel units is uneven, a problem of severe color inconsistency may easily occur when the display panel is viewed in different directions. Then chromatic aberration in different directions occurs, i.e., chromatic aberration symmetry is poor. Further, since the anode patterns are formed on the planarization layer, flatness of a surface of the planarization layer used to form the anode patterns determines flatness of the surface of the anode patterns used to form the sub-pixel units.

Figure 1:
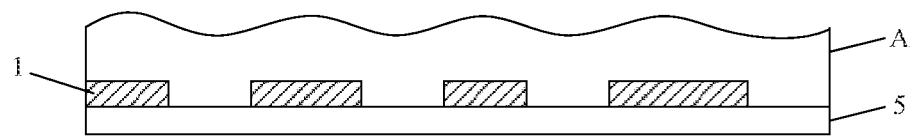
FIG. 1 is a schematic diagram illustrating a planarization layer formed on a functional pattern in the related art.

Based on this, it has been further studied that, when actually forming the planarization layer, a planarization material film is formed first, and a surface of the planarization material film away from the thin film transistor array layer has good flatness. Then the planarization material film is cured to form the planarization layer, and since there may be a metal wiring in some parts of the thin film transistor array layer covered by the planarization layer and there may be not a metal wiring in other parts, thicknesses of the planarization material film corresponding to the thin film transistor array layer at different positions are different in a direction perpendicular to the display panel. At this time, in a case that the planarization material film is cured, respective shrinkage amounts of each of a part of the planarization material film that covers the metal wiring and a part that does not cover the metal wiring in the direction perpendicular to the display panel are inconsistent. In more detail, a thicknesses of the part of the planarization material film covering the metal wiring in the direction perpendicular to the display panel is small, and the corresponding shrinkage amount in the direction perpendicular to the display panel during be cured is small, while a thicknesses of the part of the planarization material film that does not cover the metal wiring in the direction perpendicular to the display panel is large, and the corresponding shrinkage amount in the direction perpendicular to the display panel during be cured is large. Therefore, in the direction perpendicular to the display panel, a height of a part of the planarization layer formed after being cured (A shown in FIG. 1) that covers the metal wiring is larger than a height of a part of the planarization layer formed after being cured that does not cover the metal wiring. In this way, when forming the anode pattern that covers both the part of the planarization layer that covers the metal wiring and the part of the planarization layer that does not cover the metal wiring, the sub-pixel units and the cathode layer located above the anode pattern, all the anode pattern, the sub-pixel units and the cathode layer located above the anode pattern are uneven, resulting in poor symmetry.

Figure 2:
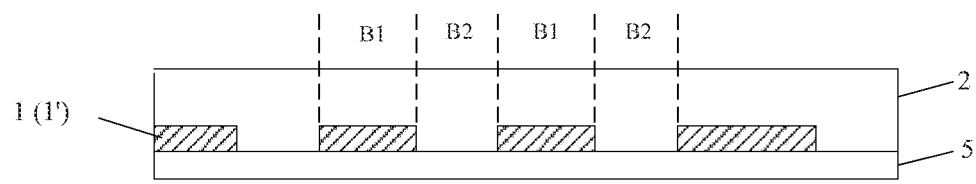
FIG. 2 is a schematic diagram illustrating a planarization layer formed on a functional pattern according to an embodiment of the present disclosure.

Based on the above analysis, as shown in FIG. 2, a display substrate is provided in an embodiment of the present disclosure, including a base substrate 5, a functional pattern 1 arranged at a side of the base substrate 5 and a planarization layer 2 arranged at a side of the functional pattern 1 away from the base substrate 5. The planarization layer 2 includes a first part B1 and a second part B2, an orthographic projection of the first part B1 to the base substrate 5 coincides with an orthographic projection of the functional pattern 1 to the base substrate 5, and an orthographic projection of the second part B2 to the base substrate 5 does not overlap the orthographic projection of the functional pattern 1 to the base substrate 5. In a direction perpendicular to the base substrate 5, a height from a surface of the first part B1 away from the base substrate 5 and a height from a surface of the second part B2 away from the base substrate 5 are identical.

Optionally, the surface of the first part B1 of the planarization layer 2 away from the base substrate is flush with the surface of the second part B2 of the planarization layer away from the base substrate, and the surface of the first part B1 of the planarization layer away from the base substrate and the surface of the second part B2 of the planarization layer away from the base substrate are on a same plane.

Optionally, a sum of a thickness of the first part B1 of the planarization layer and a thickness of the functional pattern 1 is identical to a thickness of the second part B2 of the planarization layer.

Optionally, the functional pattern 1 includes a plurality of functional sub-patterns 1', and the orthographic projection of the second part B2 of the planarization layer to the base substrate is located between orthographic projections of adjacent functional sub-patterns 1' to the base substrate.

To be specific, when manufacturing the above-mentioned display substrate, for example, a thin film transistor array layer may be formed on the base substrate 5 first. The thin film transistor array layer includes a plurality of thin film transistors arranged in an array, and each thin film transistor includes a functional pattern such as a gate electrode, an active layer and a source-drain metal layer, an insulation layer arranged between the gate electrode and the active layer, and an insulation layer arranged between the active layer and the source-drain metal layer. All the gate electrode, the active layer and the source-drain metal layer are independent patterns, and each insulation layer is a whole layer of film. Therefore, in a case that a surface of the formed thin film transistor array layer away from the base substrate 5 is uneven, in the direction perpendicular to the base substrate 5, a height of a part where there is the functional pattern 1 is larger than a height of a part where there is not the functional pattern 1. After the thin film transistor array layer is formed, the planarization layer 2 is formed on the surface of the thin film transistor array layer away from the base substrate 5. The formed planarization layer 2 includes the first part and the second part, the orthographic projection of the first part (that covers the functional pattern 1) to the base substrate 5 overlaps the orthographic projection of the functional pattern 1 to the base substrate 5, and the orthographic projection of the second part (that does not cover the functional pattern 1) to the base substrate 5 does not overlap the orthographic projection of the functional pattern 1 to the base substrate 5. In the direction perpendicular to the base substrate 5, the height from the surface of the first part away from the base substrate 5 to the surface of the base substrate 5 formed with the functional pattern 1 and the height from the surface of the second part away from the base substrate 5 to the surface of the base substrate 5 formed with the functional pattern 1 are identical. After the planarization layer 2 is formed, an anode layer may be formed on a surface of the planarization layer 2 away from the base substrate 5, and further sub-pixel units and a cathode layer may be formed on a surface of the anode layer away from the base substrate 5.

According to the specific structure and manufacturing process of the display substrate in the above embodiment, the planarization layer 2 is provided at the side of the functional pattern 1 away from the base substrate 5 in the display substrate of the embodiment of the present disclosure, the planarization layer 2 includes the first part that covers the functional pattern 1 and the second part that does not cover the functional pattern 1, and in the direction perpendicular to the base substrate 5, the height from the surface of the first part away from the base substrate 5 to the surface of the base substrate 5 formed with the functional pattern 1 and the height from the surface of the second part away from the base substrate 5 to the surface of the base substrate 5 formed with the functional pattern 1 are identical. Therefore, in the display substrate of the embodiment of the present disclosure, a surface of the planarization layer 2 for forming the anode layer formed on the functional pattern 1 has good flatness, such that when the anode layer is formed on the planarization layer 2, it is able to ensure that the anode layer has good flatness, thereby ensuring that both the sub-pixel units and the cathode layer formed on the anode layer have good flatness, solving the problem of poor chromatic aberration symmetry and guaranteeing a display performance of the display panel.

Figure 3:
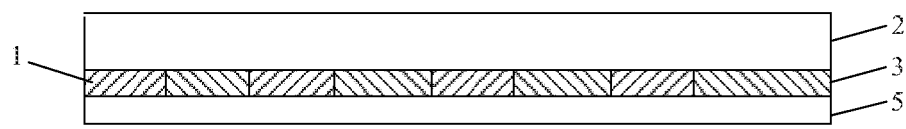
FIG. 3 is a schematic diagram illustrating a functional pattern and a compensation functional pattern arranged at an identical layer according to an embodiment of the present disclosure.
Figure 4:
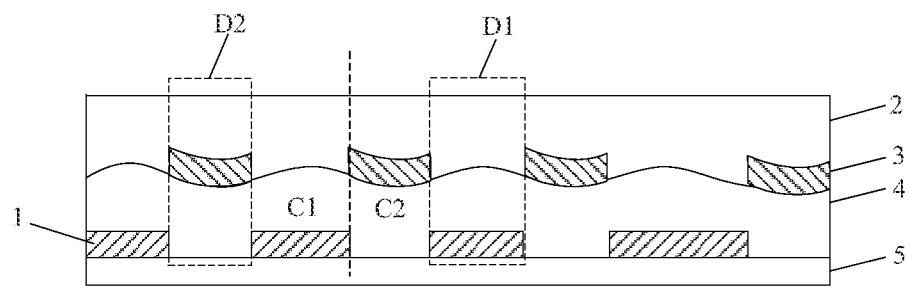
FIG. 4 is a schematic diagram illustrating the functional pattern and the compensation functional pattern arranged in different layers according to an embodiment of the present disclosure.

In some embodiments, as shown in FIG. 3 and FIG. 4, the display substrate in the above embodiment further includes a compensation functional pattern 3 insulated from the functional pattern 1. The orthographic projection of the functional pattern 1 to the base substrate 5 is complementary to an orthographic projection of the compensation functional pattern 3 to the base substrate 5.

Figure 5:
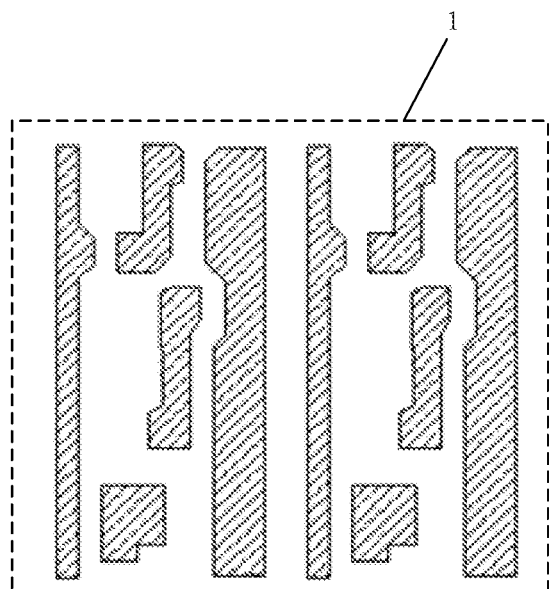
FIG. 5 is a schematic top view of the functional pattern according to an embodiment of the present disclosure.
Figure 6:
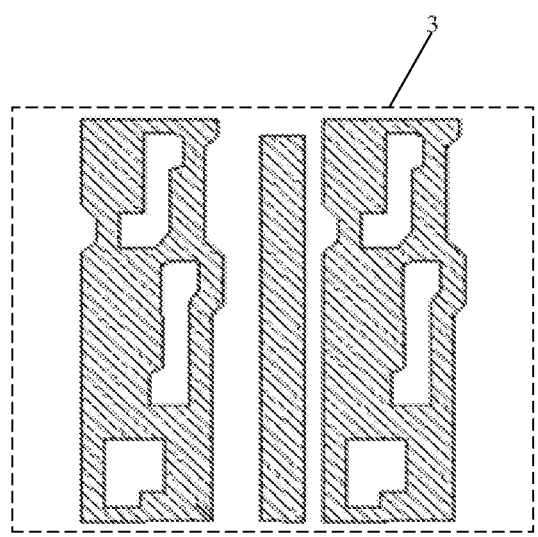
FIG. 6 is a schematic top view of the compensation functional pattern according to an embodiment of the present disclosure.

To be specific, the compensation functional pattern 3 and the functional pattern 1 arranged on the display substrate may be at an identical layer (as shown in FIG. 3) or in different layers (as shown in FIG. 4), and the material of the compensation functional pattern 3 may be selected according to practical requirements, as long as the compensation functional pattern 3 is insulated from the functional pattern 1 and the orthographic projection of the compensation functional pattern 3 to the base substrate 5 is complementary to the orthographic projection of the functional pattern 1 to the base substrate 5. It should be appreciated that, as shown in FIG. 5 and FIG. 6, the orthographic projection of the compensation functional pattern 3 to the base substrate 5 being complementary to the orthographic projection of the functional pattern 1 to the base substrate 5 refers to that the orthographic projection of the compensation functional pattern 3 to the base substrate 5 and the orthographic projection of the functional pattern 1 to the base substrate 5 may form a complete plane with no gap in therebetween.

The above-mentioned compensation functional pattern 3 is provided in the display substrate, such that the compensation functional pattern 3 may compensate for a level difference generated by the functional pattern 1 in the display substrate, and a surface of a film layer used to form the planarization layer 2 in the display substrate has good flatness. In this way, when a planarization material film is cured to form the planarization layer 2, thicknesses of parts of the planarization material film at different positions in the direction perpendicular to the base substrate 5 are identical, and shrinkage amounts during being cured are identical, thereby ensuring that the surface of the planarization layer 2 away from base substrate 5 has good flatness, which is conducive to mitigating the problem of poor chromatic aberration symmetry.

As shown in FIG. 3, in some embodiments, the functional pattern 1 and the compensation functional pattern 3 are at an identical layer, the compensation functional pattern 3 is covered by the second part of the planarization layer 2, and in the direction perpendicular to the base substrate 5, a thickness of the compensation functional pattern 3 and a thickness of the functional pattern 1 are identical.

To be specific, the functional pattern 1 and the compensation functional pattern 3 are set to be at an identical layer, in the direction perpendicular to the base substrate 5, the thickness of the compensation functional pattern 3 and the thickness of the functional pattern 1 are set to be identical, and the compensation functional pattern 3 may be covered by the second part of the planarization layer 2, such that the level difference generated by the functional pattern 1 is well compensated, surface flatness of the planarization layer 2 formed subsequently may be ensured without increasing a thickness of the display substrate, which is conducive to the thinning of the display substrate. It should be appreciated that, in a case that the functional pattern 1 and the compensation functional pattern 3 are set to be at an identical layer, the compensation functional pattern 3 may be an insulation pattern to avoid such defect as short-circuit occurs between the compensation functional pattern and the functional pattern 1.

As shown in FIG. 4, in some embodiments, the compensation functional pattern 3 is located at the side of the functional pattern 1 away from the base substrate 5, and the planarization layer 2 is located at a side of the compensation functional pattern 3 away from the base substrate 5, the display substrate further includes: a compensation planarization layer 4 located between the compensation functional pattern 3 and the functional pattern 1 in the direction perpendicular to the base substrate 5. In the direction perpendicular to the base substrate 5, a sum of a thickness of the functional pattern 1, a thickness of the compensation planarization layer 4 and a thickness of the planarization layer 2 and a sum of the thickness of the compensation planarization layer 4, a thickness of the compensation functional pattern 3 and the thickness of the planarization layer 2 are identical.

Optionally, the compensation planarization layer includes a first part C1 and a second part, an orthographic projection of the first part C1 of the compensation planarization layer to the base substrate overlaps the orthographic projection of the first part B1 of the planarization layer to the base substrate, and an orthographic projection of the second part C2 of the compensation planarization layer to the base substrate coincides with the orthographic projection of the second part B2 of the planarization layer to the base substrate.

Optionally, in the direction perpendicular to the base substrate, a sum of a thickness of the first part B1 of the planarization layer, a thickness of the first part C1 of the compensation planarization layer and the thickness of the functional pattern 1 is identical to a sum of a thickness of the second part B2 of the planarization layer, a thickness of the second part C2 of the compensation planarization layer and the thickness of the compensation functional pattern 3.

To be specific, the compensation functional pattern 3 in the above-mentioned embodiment may include a conductive pattern arranged in a different layer from the functional pattern 1. In this case, the compensation planarization layer 4 may be arranged between the compensation functional pattern 3 and the functional pattern 1 in the direction perpendicular to the base substrate 5. Optionally, the compensation planarization layer 4 may be an insulation layer to ensure that the functional pattern 1 and the compensation functional pattern 3 are insulated from each other, thereby ensuring the reliability of the display substrate. Moreover, in the direction perpendicular to the base substrate 5, the sum (a thickness corresponding to D1 in FIG. 4) of the thickness of the functional pattern 1, the thickness of the compensation planarization layer 4 and the thickness of the planarization layer 2 and the sum (a thickness corresponding to D2 in FIG. 4) of the thickness of the compensation planarization layer 4, the thickness of the compensation functional pattern 3 and the thickness of the planarization layer 2 may be set to be identical, such that the compensation functional pattern 3 may well compensate for the level difference generated by the functional pattern 1, and the planarization layer 2 formed subsequently at a side of the functional pattern 1 and the compensation functional pattern 3 away from the base substrate 5 may have good flatness, which is conducive to mitigating the problem of poor chromatic aberration symmetry.

Further, the compensation planarization layer 4 and the planarization layer 2 may be made of a same material, when forming the compensation planarization layer 4 and the planarization layer 2, in the direction perpendicular to the base substrate 5, a maximum thickness of a compensation planarization material film for forming the compensation planarization layer 4 is identical to a maximum thickness of the planarization material film for forming the planarization layer 2.

To be specific, after forming the functional pattern 1, a same material as that of the planarization layer 2 may be used to form the compensation planarization material film at the side of the functional pattern 1 away from the base substrate 5, and then the compensation planarization material film is cured to form the compensation planarization layer 4. Next, the compensation functional pattern 3 is formed at a side of the compensation planarization layer 4 away from the base substrate 5, and then the planarization material film is formed at the side of the compensation functional pattern 3 away from the base substrate 5. In the direction perpendicular to the base substrate 5, the maximum thickness of the planarization material film is identical to the maximum thickness of the compensation planarization material film. Then the planarization material film is cured to form the planarization layer 2.

It should be appreciated that, since the maximum thickness of the planarization material film is set to be identical to the maximum thickness of the compensation planarization material film, when the planarization material film is cured to form the planarization layer 2 and the compensation planarization material film is cured to form the compensation planarization layer 4, a shrinkage amount of the planarization material film is complementary to a shrinkage amount of the compensation planarization material film, thereby ensuring that the surface of the formed planarization layer 2 has good flatness, which is conducive to mitigating the problem of poor chromatic aberration symmetry.

It should be appreciated that, the shrinkage amount of the planarization material film being complementary to the shrinkage amount of the compensation planarization material film refers to that a shrinkage amount of a part of the planarization material film covering the compensation functional pattern 3 during being cured is identical to a shrinkage amount of a part of the compensation planarization material film covering the functional pattern 1 during being cured, and a shrinkage amount of a part of the planarization material film that does not cover the compensation functional pattern 3 during being cured is identical to a shrinkage amount of a part of the compensation planarization material film does not cover the functional pattern 1 during being cured.

In some embodiments, the display substrate further includes an anode layer located on a surface of the planarization layer 2 away from the base substrate.

A surface of the planarization layer 2 in the display substrate for forming the anode layer has good flatness, such that when the anode layer is formed on the planarization layer 2, it is able to ensure that the anode layer has good flatness, thereby ensuring that the sub-pixel units and the cathode layer formed on the anode layer have good flatness, solving the problem of poor chromatic aberration symmetry and guaranteeing a display performance of the display panel.

A display device including the above display substrate is further provided in the embodiment of the present disclosure.

In the display substrate of the above embodiment, the surface of the planarization layer 2 for forming the anode layer formed on the functional pattern 1 has good flatness, such that when the anode layer is formed on the planarization layer 2, it is able to ensure that the anode layer has good flatness, thereby solving the problem of poor chromatic aberration symmetry. Therefore, the problem of poor chromatic aberration symmetry may also be avoided in the display device including the above display substrate in the embodiment of the present disclosure, thereby realizing a better display performance of the display device.

It should be appreciated that, the display device may be any product or component with a display function, such as a TV, a monitor, a digital photo frame, a mobile phone, a tablet computer.

A method of manufacturing the above display substrate is further provided in the embodiment of the present disclosure, including: providing the base substrate 5; forming the functional pattern on the base substrate 5; and forming the planarization layer at the side of the functional pattern away from the base substrate 5, where the planarization layer includes the first part and the second part, the orthographic projection of the first part to the base substrate 5 coincides with the orthographic projection of the functional pattern to the base substrate 5, the orthographic projection of the second part to the base substrate 5 does not overlap the orthographic projection of the functional pattern to the base substrate 5, and in the direction perpendicular to the base substrate 5, the height from the surface of the first part away from the base substrate 5 to the surface of the base substrate 5 formed with the functional pattern and the height from the surface of the second part away from the base substrate 5 to the surface of the base substrate 5 formed with the functional pattern are identical.

To be specific, when manufacturing the above-mentioned display substrate, there are various types of base substrate 5 that may be used. For example, a glass base substrate is used to manufacture the display substrate. After determining the type of base substrate 5 to be used, a thin film transistor array layer may be formed on the base substrate 5. The thin film transistor array layer includes a plurality of thin film transistors arranged in an array, and each thin film transistor includes a functional pattern such as a gate electrode, an active layer and a source-drain metal layer, an insulation layer arranged between the gate electrode and the active layer, and an insulation layer arranged between the active layer and the source-drain metal layer. Then the planarization layer is formed on a surface of the thin film transistor array layer away from the base substrate 5. The formed planarization layer includes the first part and the second part, the orthographic projection of the first part (that covers the functional pattern) to the base substrate 5 overlaps the orthographic projection of the functional pattern to the base substrate 5, and the orthographic projection of the second part (that does not cover the functional pattern) to the base substrate 5 does not overlap the orthographic projection of the functional pattern to the base substrate 5. In the direction perpendicular to the base substrate 5, the height from the surface of the first part away from the base substrate 5 to the surface of the base substrate 5 formed with the functional pattern 1 and the height from the surface of the second part away from the base substrate 5 to the surface of the base substrate 5 formed with the functional pattern 1 are identical. After the planarization layer 2 is formed, an anode layer may be formed on a surface of the planarization layer 2 away from the base substrate 5, and further sub-pixel units and a cathode layer may be formed on a surface of the anode layer away from the base substrate 5.

In the method of forming the display substrate in the embodiment of the present disclosure, the functional pattern is formed on the base substrate 5 first, and the planarization layer is formed at the side of the functional pattern away from the base substrate 5. The formed planarization layer includes the first part that covers the functional pattern and the second part that does not cover the functional pattern, and in the direction perpendicular to the base substrate 5, the height from the surface of the first part away from the base substrate 5 to the surface of the base substrate 5 formed with the functional pattern and the height from the surface of the second part away from the base substrate 5 to the surface of the base substrate 5 formed with the functional pattern are identical. Therefore, the surface of the planarization layer for forming the anode layer has good flatness, such that when the anode layer is continued to be formed on the planarization layer, it is able to ensure that the anode layer has good flatness, thereby ensuring that both the sub-pixel units and the cathode layer formed on the anode layer have good flatness, solving the problem of poor chromatic aberration symmetry and guaranteeing a display performance of the display panel As shown in FIG. 3 and FIG. 4, in some embodiments, the forming the functional pattern 1 on the base substrate 5 includes: forming the functional pattern 1 and a compensation functional pattern 3 insulated from the functional pattern 1. The orthographic projection of the functional pattern 1 to the base substrate 5 is complementary to an orthographic projection of the compensation functional pattern 3 to the base substrate 5.

To be specific, the compensation functional pattern 3 and the functional pattern 1 arranged on the display substrate may be at an identical layer (as shown in FIG. 3) or in different layers (as shown in FIG. 4), and the material of the compensation functional pattern 3 may be selected according to practical requirements, as long as the compensation functional pattern 3 is insulated from the functional pattern 1 and the orthographic projection of the compensation functional pattern 3 to the base substrate 5 is complementary to the orthographic projection of the functional pattern 1 to the base substrate 5.

In the method of the above embodiment, the above-mentioned compensation functional pattern 3 is formed in the display substrate, such that the compensation functional pattern 3 may compensate for a level difference generated by the functional pattern 1 in the display substrate, and a surface of a film layer used to form the planarization layer 2 in the display substrate has good flatness. In this way, when a planarization material film is cured to form the planarization layer 2, thicknesses of parts of the planarization material film at different positions in the direction perpendicular to the base substrate 5 are identical, and shrinkage amounts during being cured are identical, thereby ensuring that the surface of the planarization layer 2 away from base substrate 5 has good flatness, which is conducive to mitigating the problem of poor chromatic aberration symmetry.

As shown in FIG. 3, in some embodiments, the forming the functional pattern 1 and the compensation functional pattern 3 includes: forming a functional film layer by using a metallic conductive material; patterning the functional film layer to form the functional pattern 1 by using a first mask including a light-transmitting region and a light-shielding region; forming an insulation film layer by using an insulation material at the side of the functional pattern 1 away from the base substrate; and patterning the insulation film layer to form the compensation functional pattern 3 by using a second mask including a light-transmitting region and a light-shielding region. The functional pattern 1 and the compensation functional pattern 3 are at an identical layer, and the compensation functional pattern 3 is covered by the second part of the planarization layer 2. In the direction perpendicular to the base substrate 5, a thickness of the compensation functional pattern 3 and a thickness of the functional pattern 1 are identical. In a case the first mask and the second mask are superposed on the base substrate 5, an orthographic projection of the light-transmitting region of the second mask to the base substrate 5 overlaps an orthographic projection of the light-shielding region of the first mask to the base substrate 5, and an orthographic projection of the light-shielding region of the second mask to the base substrate 5 overlaps an orthographic projection of the light-transmitting region of the first mask to the base substrate 5.

To be specific, a metallic conductive material is used to form a functional film layer through a sputtering process first, and a photoresist layer is formed on the functional film layer, and then the photoresist layer is exposed by using a first mask including a light-transmitting region and a light-shielding region to form a photoresist reserved region and a photoresist removed region. The photoresist reserved region corresponds to a region where the functional pattern 1 is located, and the photoresist removed region corresponds to other regions except the region where the functional pattern 1 is located. Then the exposed photoresist layer is developed by using a developer to remove the photoresist layer in photoresist-removed region, and the photoresist layer in the photoresist reserved region is taken as a mask, the functional film layer in the photoresist-removed region is etched by using the mask to remove the functional film layer in the photoresist removed region. Finally, the photoresist layer in the photoresist reserved region is peeled off to form the functional pattern 1.

An insulation film layer is formed at the side of the functional pattern 1 away from the base substrate 5 by using an insulation material (such as a resin material), and the insulation film layer is exposed using a second mask including a light-transmitting region and a light-shielding region to forming an insulation film layer reserved region and an insulation film layer removed region. The insulation film layer removed region corresponds to a region where the functional pattern 1 is located, and the insulation film layer reserved region a region where the compensation functional pattern 3 is located. Then the exposed insulation film is developed by using a developer to remove the insulation film layer in the insulation film layer removed region, and the compensation functional pattern is formed.

The compensation functional pattern and the functional pattern 1 are set to be at an identical layer, in the direction perpendicular to the base substrate 5, the thickness of the compensation functional pattern 3 and the thickness of the functional pattern 1 are set to be identical, and the compensation functional pattern 3 may be covered by the second part of the planarization layer 2, such that the level difference generated by the functional pattern 1 is well compensated, surface flatness of the planarization layer 2 formed subsequently may be ensured without increasing a thickness of the display substrate, which is conducive to the thinning of the display substrate. It should be appreciated that, in a case that the functional pattern 1 and the compensation functional pattern 3 are set to be at an identical layer, the compensation functional pattern 3 may be an insulation pattern to avoid such defect as short-circuit occurs between the compensation functional pattern and the functional pattern 1.

It should be appreciated that, in a case the first mask and the second mask are superposed on the base substrate 5, an orthographic projection of the light-transmitting region of the second mask to the base substrate 5 overlaps an orthographic projection of the light-shielding region of the first mask to the base substrate 5, and an orthographic projection of the light-shielding region of the second mask to the base substrate 5 overlaps an orthographic projection of the light-transmitting region of the first mask to the base substrate 5. Thus, when the functional pattern 1 and the insulation pattern are formed by using the first mask and the second mask, the orthographic projection of the functional pattern 1 to the base substrate is complementary to an orthographic projection of the insulation pattern to the base substrate 5.

Figure 7:
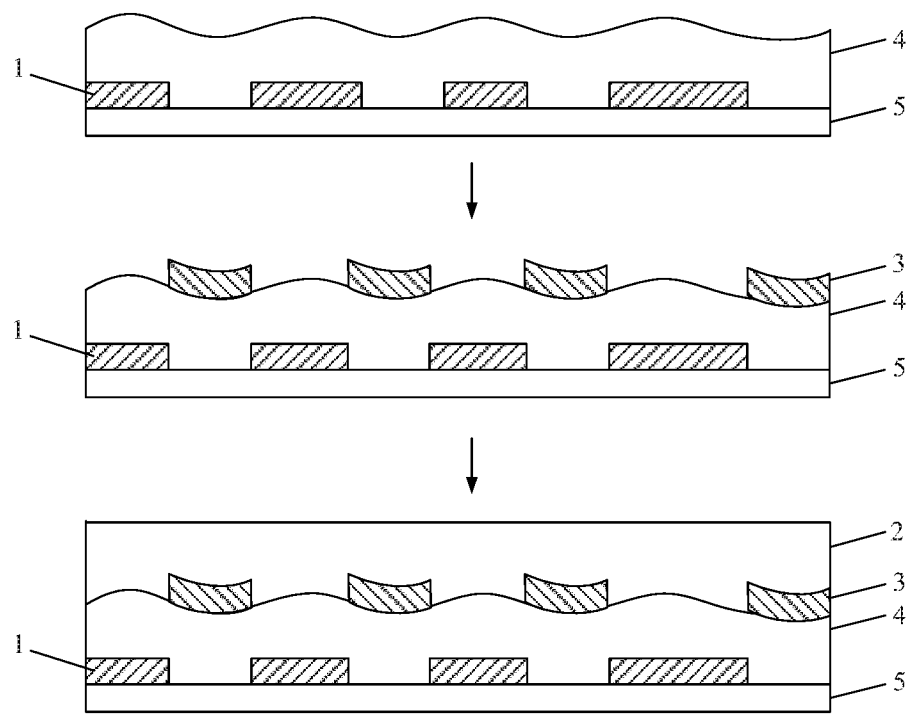
FIG. 7 is a schematic diagram illustrating a process of forming the functional pattern and the compensation functional pattern arranged in different layers according to an embodiment of the present disclosure.

As shown in FIG. 7, in some embodiments, the forming the functional pattern 1 and the compensation functional pattern 3 includes: forming a functional film layer by using a metallic conductive material; patterning the functional film layer to form the functional pattern 1 by using a first mask including a light-transmitting region and a light-shielding region; forming a compensation planarization layer 4 at the side of the functional pattern 1 away from the base substrate; forming a compensation functional film layer at a side of the compensation planarization layer 4 away from the base substrate 5 by using the metallic conductive material; patterning the compensation functional film layer to form the compensation functional pattern 3 by using a second mask including a light-transmitting region and a light-shielding region; in a case the first mask and the second mask are superposed on the base substrate 5, an orthographic projection of the light-transmitting region of the second mask to the base substrate 5 overlaps an orthographic projection of the light-shielding region of the first mask to the base substrate 5, and an orthographic projection of the light-shielding region of the second mask to the base substrate 5 overlaps an orthographic projection of the light-transmitting region of the first mask to the base substrate 5; and the forming the planarization layer 2 at the side of the functional pattern 1 away from the base substrate 5 includes: forming the planarization layer 2 at a side of the compensation functional pattern 3 away from the base substrate 5, in the direction perpendicular to the base substrate 5, a sum of a thickness of the functional pattern 1, a thickness of the compensation planarization layer 4 and a thickness of the planarization layer 2 and a sum of the thickness of the compensation planarization layer 4, a thickness of the compensation functional pattern 3 and the thickness of the planarization layer 2 are identical.

To be specific, a metallic conductive material is used to form a functional film layer through a sputtering process first, and a photoresist layer is formed on the functional film layer, and then the photoresist layer is exposed by using a first mask including a light-transmitting region and a light-shielding region to form a photoresist reserved region and a photoresist removed region. The photoresist reserved region corresponds to a region where the functional pattern 1 is located, and the photoresist removed region corresponds to other regions except the region where the functional pattern 1 is located. Then the exposed photoresist layer is developed by using a developer to remove the photoresist layer in photoresist removed region, and the photoresist layer in the photoresist reserved region is taken as a mask, the functional film layer in the photoresist removed region is etched by using the mask to remove the functional film layer in the photoresist removed region. Finally, the photoresist layer in the photoresist reserved region is peeled off to form the functional pattern 1.

A compensation planarization layer 4 is formed at the side of the functional pattern 1 away from the base substrate 5, and a compensation functional film layer is formed at a side of the compensation planarization layer 4 away from the base substrate 5 by using a metallic conductive material through a sputtering process. Next, a photoresist layer is formed on the compensation functional film layer, and the photoresist layer is exposed by using a second mask including a light-transmitting region and a light-shielding region to form a photoresist reserved region and a photoresist removed region. The photoresist reserved region corresponds to a region where the compensation functional pattern 3 is located, and the photoresist removed region corresponds to other regions except the region where the compensation functional pattern 3 is located. Then the exposed photoresist layer is developed by using a developer to remove the photoresist layer in photoresist removed region, and the photoresist layer in the photoresist-reserved region is taken as a mask, the compensation functional film layer in the photoresist-removed region is etched by using the mask to remove the compensation functional film layer in the photoresist-removed region. Finally, the photoresist layer in the photoresist reserved region is peeled off to form the compensation functional pattern 3. After forming the compensation functional pattern 3, the planarization layer 2 is formed at a side of the compensation functional pattern 3 away from the base substrate 5. It should be appreciated that, in the direction perpendicular to the base substrate 5, a sum of a thickness of the functional pattern 1, a thickness of the compensation planarization layer 4 and a thickness of the planarization layer 2 and a sum of the thickness of the compensation planarization layer 4, a thickness of the compensation functional pattern 3 and the thickness of the planarization layer 2 are identical.

It should be appreciated that, in a case the first mask and the second mask are superposed on the base substrate 5, an orthographic projection of the light-transmitting region of the second mask to the base substrate 5 overlaps an orthographic projection of the light-shielding region of the first mask to the base substrate 5, and an orthographic projection of the light-shielding region of the second mask to the base substrate 5 overlaps an orthographic projection of the light-transmitting region of the first mask to the base substrate 5. Thus, when the functional pattern 1 and the compensation functional pattern 3 are formed by using the first mask and the second mask, the orthographic projection of the functional pattern 1 to the base substrate is complementary to an orthographic projection of the compensation functional pattern 3 to the base substrate 5.

In the method of the above embodiment, when the compensation functional pattern 3 arranged in a different layer from the functional pattern 1 is formed, the compensation planarization layer 4 may be arranged between the compensation functional pattern 3 and the functional pattern 1 in the direction perpendicular to the base substrate 5. Optionally, the compensation planarization layer 4 may be an insulation layer to ensure that the functional pattern 1 and the compensation functional pattern 3 are insulated from each other, thereby ensuring the reliability of the display substrate. Moreover, in the direction perpendicular to the base substrate 5, the sum (a thickness corresponding to D1 in FIG. 4) of the thickness of the functional pattern 1, the thickness of the compensation planarization layer 4 and the thickness of the planarization layer 2 and the sum (a thickness corresponding to D2 in FIG. 4) of the thickness of the compensation planarization layer 4, the thickness of the compensation functional pattern 3 and the thickness of the planarization layer 2 may be set to be identical, such that the compensation functional pattern 3 may well compensate for the level difference generated by the functional pattern 1, and the planarization layer 2 formed subsequently at a side of the functional pattern 1 and the compensation functional pattern 3 away from the base substrate 5 may have good flatness, which is conducive to mitigating the problem of poor chromatic aberration symmetry.

Further, the compensation planarization layer 4 and the planarization layer 2 may be made of a same material, when forming the compensation planarization layer 4 and the planarization layer 2, in the direction perpendicular to the base substrate 5, a maximum thickness of a compensation planarization material film for forming the compensation planarization layer 4 is identical to a maximum thickness of the planarization material film for forming the planarization layer 2.

To be specific, after forming the functional pattern 1, a same material as that of the planarization layer 2 may be used to form the compensation planarization material film at the side of the functional pattern 1 away from the base substrate 5, and then the compensation planarization material film is cured to form the compensation planarization layer 4. Next, the compensation functional pattern 3 is formed at a side of the compensation planarization layer 4 away from the base substrate 5, and then the planarization material film is formed at the side of the compensation functional pattern 3 away from the base substrate 5. In the direction perpendicular to the base substrate 5, the maximum thickness of the planarization material film is identical to the maximum thickness of the compensation planarization material film. Then the planarization material film is cured to form the planarization layer 2.

It should be appreciated that, since the maximum thickness of the planarization material film is set to be identical to the maximum thickness of the compensation planarization material film, when the planarization material film is cured to form the planarization layer 2 and the compensation planarization material film is cured to form the compensation planarization layer 4, a shrinkage amount of the planarization material film is complementary to a shrinkage amount of the compensation planarization material film, thereby ensuring that the surface of the formed planarization layer 2 has good flatness, which is conducive to mitigating the problem of poor chromatic aberration symmetry.

It should be appreciated that, the shrinkage amount of the planarization material film being complementary to the shrinkage amount of the compensation planarization material film refers to that a shrinkage amount of a part of the planarization material film covering the compensation functional pattern 3 during being cured is identical to a shrinkage amount of a part of the compensation planarization material film covering the functional pattern 1 during being cured, and a shrinkage amount of a part of the planarization material film that does not cover the compensation functional pattern 3 during being cured is identical to a shrinkage amount of a part of the compensation planarization material film does not cover the functional pattern 1 during being cured.

In some embodiments, the method further includes: forming an anode layer on a surface of the planarization layer 2 away from the base substrate 5.

A surface of the planarization layer 2 in the display substrate for forming the anode layer has good flatness, such that when the anode layer is formed on the planarization layer 2, it is able to ensure that the anode layer has good flatness, thereby ensuring that both the sub-pixel units and the cathode layer formed on the anode layer have good flatness, solving the problem of poor chromatic aberration symmetry and guaranteeing a display performance of the display panel.

Figure 8:
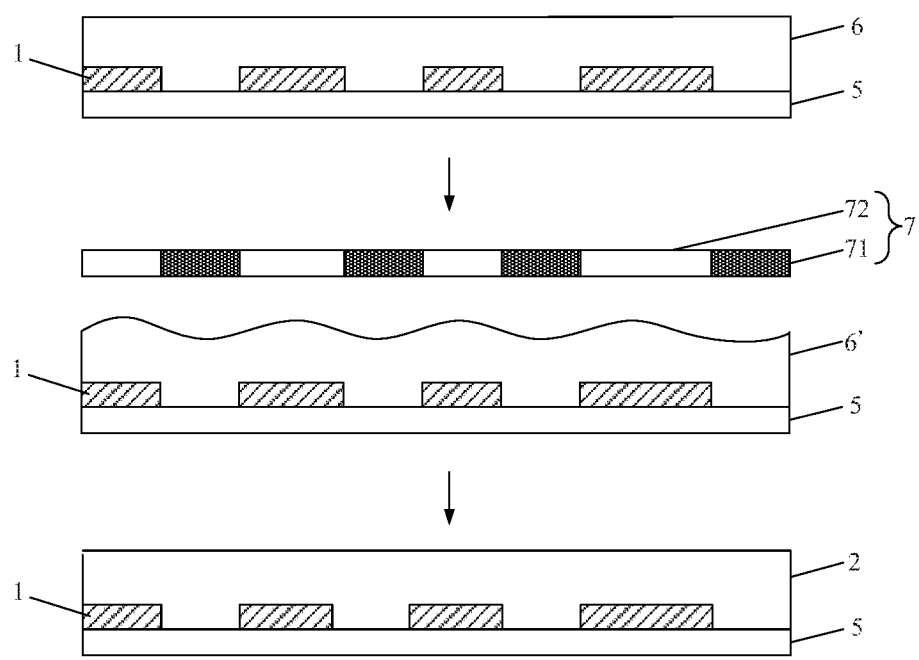
FIG. 8 is a schematic diagram illustrating a process of forming a planarization layer according to an embodiment of the present disclosure.

In some embodiments, as shown in FIG. 8, the forming the planarization layer 2 may include: forming a planarization material film, where the planarization material film includes a first part covering the functional pattern 1 and a second part not covering the functional pattern 1, and in the direction perpendicular to the base substrate 5, a height from a surface of the first part of the planarization material film away from the base substrate to a surface of the base substrate formed with the functional pattern and a height from a surface of the second part of the planarization material film away from the base substrate to the surface of the base substrate formed with the functional pattern are identical; curing the planarization material film; determining a difference between respective shrinkage amounts corresponding to the first part and the second part of the planarization material film after being cured in the direction perpendicular to the base substrate 5; forming a target mask 7 in accordance with the difference between the respective shrinkage amounts corresponding to the first part and the second part of the planarization material film after being cured; where the target mask 7 includes a target light-shielding region 71 and a target light-transmitting region 72, and an exposure depth corresponding to the target light-transmitting region 72 in the direction perpendicular to the base substrate is identical to the difference in a case that the cured planarization material film (6' shown in FIG. 8) is exposed by using the target mask 7; exposing the cured planarization material film (6' shown in FIG. 8) by using the target mask 7 to form a planarization material film reserved region and a planarization material film semi-reserved region, where the planarization material film semi-reserved region corresponds to a region where a part of the planarization layer 2 covering the functional pattern 1 is located, and the planarization material film reserved region corresponds to other regions except the region where the part of the planarization layer 2 covering the functional pattern 2 is located; and removing the planarization material film in the planarization material film semi-reserved region by using a developer to form the planarization layer 2.

To be specific, there are various manners to determine the difference between the respective shrinkage amounts corresponding to the first part and the second part of the planarization material film after being cured in the direction perpendicular to the base substrate 5. For example, a planarization material film is directly formed on the functional pattern 1 first, and then the planarization material film is cured to form a test planarization layer 2. A first height from a surface of a part of the test planarization layer 2 that covers the functional pattern 1 away from the base substrate 5 to the surface of the base substrate 5 formed with the functional pattern 1 is measured, and a second height from a surface of a part of the test planarization layer 2 that does not cover the functional pattern 1 away from the base substrate 5 to the surface of the base substrate 5 formed with the functional pattern 1 is measured. A difference between the respective shrinkage amounts corresponding to the first part and the second part of the planarization material film after being cured by calculating a difference between the first height and the second height. Further, a target mask is formed in accordance with the difference, and the target mask includes a target light-shielding region and a target light-transmitting region, and in a case that the cured planarization material film (6' shown in FIG. 8) is exposed by using the target mask 7, an exposure depth corresponding to the target light-transmitting region 72 in the direction perpendicular to the base substrate is identical to the difference between the respective shrinkage amounts corresponding to the first part and the second part of the planarization material film after being cured.

In more detail, referring to FIG. 8, when forming the planarization layer 2, a planarization material film 6 is formed first. The planarization material film 6 includes a first part covering the functional pattern 1 and a second part not covering the functional pattern 1. In the direction perpendicular to the base substrate 5, a height from a surface of the first part of the planarization material film 6 away from the base substrate 5 to the surface of the base substrate 5 formed with the functional pattern 1 and a height from a surface of the second part of the planarization material film 6 away from the base substrate 5 to the surface of the base substrate 5 formed with the functional pattern 1 are identical. Next, the planarization material film 6 is cured to acquire a cured planarization material film (6' shown in FIG. 8). Then the cured planarization material film is exposed by using the target mask 7 to form a planarization material film reserved region and a planarization material film semi-reserved region, where the planarization material film semi-reserved region corresponds to a region where a part of the planarization layer 2 covering the functional pattern 1 is located, and the planarization material film reserved region corresponds to other regions except the region where the part of the planarization layer 2 covering the functional pattern 1 is located. Finally, the planarization material film in the planarization material film semi-reserved region is removed by using a developer to form the planarization layer 2.

When the planarization layer 2 is formed by using the method in the above embodiment, the target mask may be formed first in accordance with the difference between the respective shrinkage amounts corresponding to the first part and the second part of the planarization material film 6 after being cured acquired in advance. Then the cured planarization material film (6' shown in FIG. 8) is patterned by using the target mask, and a convex part of a surface of the cured planarization material film away from the base substrate 5 is removed, such that the surface of the formed planarization layer 2 has good flatness, which is conducive to mitigating the problem of poor chromatic aberration symmetry.

It should be appreciated that, in addition to the target light-shielding region 71 and the target light-transmitting region 72, the target mask 7 may further include other light-transmitting regions. In a case that the cured planarization material film (6' shown in FIG. 8) is exposed, a planarization material film removed region corresponding to other light-transmitting regions may be formed. The planarization material film removed region is used to form a via hole penetrating the planarization layer 2. The anode layer and an output electrode of a corresponding transistor each on an upper side and a lower side of the planarization layer 2 may be connected to each other through the via hole.

It should be appreciated that, each embodiment in the specification is described in a progressive manner, and same or similar parts between various embodiments may be referred to among the embodiments. Each embodiment focuses on the differences from other embodiments. In particular, as for the method embodiment, since it is basically similar to the product embodiment, the method embodiment is described relatively simply, and the relevant part may be referred to in the description of the product embodiment.

Unless defined otherwise, technical or scientific terms used in the present disclosure shall have general meanings as understood by those with ordinary skills in the art. Terms "first", "second" and similar terms used in the present disclosure do not indicate any order, quantity or priority, but are used only for distinguishing different components. An expression such as "include" or "have" indicates that a component or article preceding the term encompasses components, articles or other equivalents listed after the term, without excluding other components or articles. A term "connect", "attach" or other term with similar meaning is not limited to a physical connection or a mechanical connection, but may include an electrical connection, whether direct or indirect. "Up", "down", "left", "right" and the like are only used to represent a relative position relationship. When an absolute position of a described object is changed, the relative position relationship may also change correspondingly.

It should be appreciated that, when a component such as a layer, film, region or substrate is referred to as being located "above" or "below" another component, the component may be "directly" located "above" or "below" another component, or intermediary components may exist.

In the description of the foregoing embodiments, specific features, structures, materials, or characteristics may be combined in a suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims

The invention claimed is:

1. A display substrate, comprising a base substrate, a plurality of functional patterns arranged at a side of the base substrate and a planarization layer arranged at a side of the plurality of functional patterns away from the base substrate; wherein the planarization layer comprises a first part and a second part, an orthographic projection of the first part to the base substrate coincides with an orthographic projection of the functional pattern to the base substrate, an orthographic projection of the second part to the base substrate does not overlap the orthographic projection of the functional pattern to the base substrate, and in a direction perpendicular to the base substrate, a height from a surface of the first part away from the base substrate is identical to a height from a surface of the second part away from the base substrate, the display substrate further includes a plurality of compensation functional patterns insulated from the plurality of functional patterns; and orthographic projections of the plurality of functional patterns to the base substrate and orthographic projections of the plurality of compensation functional patterns to the base substrate are directly connected end to end and cover the whole base substrate together.

2. The display substrate according to claim 1, wherein the functional pattern and the compensation functional pattern are at an identical layer, the compensation functional pattern is covered by the second part of the planarization layer, and in the direction perpendicular to the base substrate, a thickness of the compensation functional pattern is identical to a thickness of the functional pattern.

3. The display substrate according to claim 1, wherein the compensation functional pattern is located at the side of the functional pattern away from the base substrate, and the planarization layer is located at a side of the compensation functional pattern away from the base substrate;

the display substrate further comprises: a compensation planarization layer located between the compensation functional pattern and the functional pattern in the direction perpendicular to the base substrate;

in the direction perpendicular to the base substrate, a sum of a thickness of the functional pattern, a thickness of the compensation planarization layer and a thickness of the planarization layer is identical to a sum of the thickness of the compensation planarization layer, a thickness of the compensation functional pattern and the thickness of the planarization layer.

4. The display substrate according to claim 3, wherein the compensation planarization layer comprises a first part and a second part, an orthographic projection of the first part of the compensation planarization layer to the base substrate coincides with the orthographic projection of the first part of the planarization layer to the base substrate, and an orthographic projection of the second part of the compensation planarization layer to the base substrate coincides with the orthographic projection of the second part of the planarization layer to the base substrate.

5. The display substrate of claim 4, wherein in the direction perpendicular to the base substrate, a sum of a thickness of the first part of the planarization layer, a thickness of the first part of the compensation planarization layer and the thickness of the functional pattern is identical to a sum of a thickness of the second part of the planarization layer, a thickness of the second part of the compensation planarization layer and the thickness of the compensation functional pattern.

6. The display substrate according to claim 1, wherein the functional pattern comprises a plurality of functional sub-patterns, the orthographic projection of the compensation functional pattern to the base substrate is located between orthographic projections of adjacent functional sub-patterns to the base substrate, and the orthographic projection of the compensation functional pattern to the base substrate coincides with the orthographic projection of the second part of the planarization layer to the base substrate.

7. The display substrate according to claim 1, further comprising an anode layer located on a surface of the planarization layer away from the base substrate.

8. The display substrate according to claim 1, wherein the surface of the first part of the planarization layer away from the base substrate is flush with the surface of the second part of the planarization layer away from the base substrate, and the surface of the first part of the planarization layer away from the base substrate and the surface of the second part of the planarization layer away from the base substrate are on a same plane.

9. The display substrate according to claim 1, wherein a sum of a thickness of the first part of the planarization layer and a thickness of the functional pattern is identical to a thickness of the second part of the planarization layer.

10. The display substrate according to claim 1, wherein the functional pattern comprises a plurality of functional sub-patterns, and the orthographic projection of the second part of the planarization layer to the base substrate is located between orthographic projections of adjacent functional sub-patterns to the base substrate.

11. A display device, comprising the display substrate according to claim 1.

12. A method of forming the display substrate according to claim 1, comprising:

providing the base substrate;

forming the functional pattern on the base substrate; and forming the planarization layer at the side of the functional pattern away from the base substrate; wherein the planarization layer comprises the first part and the second part, the orthographic projection of the first part to the base substrate coincides with the orthographic projection of the functional pattern to the base substrate, the orthographic projection of the second part to the base substrate does not overlap the orthographic projection of the functional pattern to the base substrate, and in the direction perpendicular to the base substrate, the height from the surface of the first part away from the base substrate is identical to the height from the surface of the second part away from the base substrate.

13. The method according to claim 12, wherein the forming the functional pattern on the base substrate comprises: forming the functional pattern and a compensation functional pattern insulated from the functional pattern; wherein the orthographic projection of the functional pattern to the base substrate is complementary to an orthographic projection of the compensation functional pattern to the base substrate.

14. The method according to claim 13, wherein the forming the functional pattern and the compensation functional pattern comprises:
   forming a functional film layer by using a metallic conductive material;
   patterning the functional film layer to form the functional pattern by using a first mask comprising a light-transmitting region and a light-shielding region;
   forming an insulation film layer by using an insulation material at the side of the functional pattern away from the base substrate; and
   patterning the insulation film layer to form the compensation functional pattern by using a second mask comprising a light-transmitting region and a light-shielding region, wherein the functional pattern and the compensation functional pattern are at an identical layer, and the compensation functional pattern is covered by the second part of the planarization layer; in the direction perpendicular to the base substrate, a thickness of the compensation functional pattern and a thickness of the functional pattern are identical; in a case the first mask and the second mask are superposed on the base substrate, an orthographic projection of the light-transmitting region of the second mask to the base substrate overlaps an orthographic projection of the light-shielding region of the first mask to the base substrate, and an orthographic projection of the light-shielding region of the second mask to the base substrate overlaps an orthographic projection of the light-transmitting region of the first mask to the base substrate.

15. The method according to claim 13, wherein the forming the functional pattern and the compensation functional pattern comprises:
   forming a functional film layer by using a metallic conductive material;
   patterning the functional film layer to form the functional pattern by using a first mask comprising a light-transmitting region and a light-shielding region;
   forming a compensation planarization layer at the side of the functional pattern away from the base substrate;
   forming a compensation functional film layer at a side of the compensation planarization layer away from the base substrate by using the metallic conductive material;
   patterning the compensation functional film layer to form the compensation functional pattern by using a second mask comprising a light-transmitting region and a light-shielding region; wherein in a case the first mask and the second mask are superposed on the base substrate, an orthographic projection of the light-transmitting region of the second mask to the base substrate overlaps an orthographic projection of the light-shielding region of the first mask to the base substrate, and an orthographic projection of the light-shielding region of the second mask to the base substrate overlaps an orthographic projection of the light-transmitting region of the first mask to the base substrate; and
   the forming the planarization layer at the side of the functional pattern away from the base substrate comprises:
   forming the planarization layer at a side of the compensation functional pattern away from the base substrate, wherein in the direction perpendicular to the base substrate, a sum of a thickness of the functional pattern, a thickness of the compensation planarization layer and a thickness of the planarization layer is identical to a sum of the thickness of the compensation planarization layer, a thickness of the compensation functional pattern and the thickness of the planarization layer.

16. The method according to claim 12, further comprising: forming an anode layer on a surface of the planarization layer away from the base substrate.

17. The method according to claim 12, wherein the forming the planarization layer comprises:
   forming a planarization material film, wherein the planarization material film comprises a first part covering the functional pattern and a second part not covering the functional pattern, and in the direction perpendicular to the base substrate, a height from a surface of the first part of the planarization material film away from the base substrate to a surface of the base substrate formed with the functional pattern and a height from a surface of the second part of the planarization material film away from the base substrate to the surface of the base substrate formed with the functional pattern are identical;
   curing the planarization material film;
   determining a difference between respective shrinkage amounts corresponding to the first part and the second part of the planarization material film after being cured in the direction perpendicular to the base substrate;
   forming a target mask in accordance with the difference between the respective shrinkage amounts corresponding to the first part and the second part of the planarization material film after being cured; wherein the target mask comprises a target light-shielding region and a target light-transmitting region, and an exposure depth corresponding to the target light-transmitting region in the direction perpendicular to the base substrate is identical to the difference in a case that the cured planarization material film is exposed by using the target mask;
   exposing the cured planarization material film by using the target mask to form a planarization material film reserved region and a planarization material film semi-reserved region, wherein the planarization material film semi-reserved region corresponds to a region where a part of the planarization layer covering the functional pattern is located, and the planarization material film reserved region corresponds to other regions except the region where the part of the planarization layer covering the functional pattern is located; and
   removing the planarization material film in the planarization material film semi-reserved region by using a developer to form the planarization layer.

\* \* \* \* \*